United States Patent
Kizilyalli et al.

(10) Patent No.: US 9,525,039 B2
(45) Date of Patent: Dec. 20, 2016

(54) METHOD OF FABRICATING A MERGED P-N JUNCTION AND SCHOTTKY DIODE WITH REGROWN GALLIUM NITRIDE LAYER

(71) Applicant: AVOGY, INC., San Jose, CA (US)

(72) Inventors: Isik C. Kizilyalli, San Francisco, CA (US); Dave P. Bour, Cupertino, CA (US); Thomas R. Prunty, Sunnyvale, CA (US); Hui Nie, Cupertino, CA (US); Quentin Diduck, Santa Clara, CA (US); Ozgur Aktas, Pleasanton, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 14/853,930

(22) Filed: Sep. 14, 2015

(65) Prior Publication Data

US 2016/0005835 A1    Jan. 7, 2016

Related U.S. Application Data

(62) Division of application No. 13/866,286, filed on Apr. 19, 2013, now Pat. No. 9,159,799.

(51) Int. Cl.
| | |
|---|---|
| H01L 29/872 | (2006.01) |
| H01L 29/66 | (2006.01) |
| H01L 29/20 | (2006.01) |
| H01L 29/868 | (2006.01) |
| H01L 29/06 | (2006.01) |

(52) U.S. Cl.
CPC ...... *H01L 29/66143* (2013.01); *H01L 29/0619* (2013.01); *H01L 29/2003* (2013.01); *H01L 29/66121* (2013.01); *H01L 29/66212* (2013.01); *H01L 29/868* (2013.01); *H01L 29/872* (2013.01)

(58) Field of Classification Search
CPC ............. H01L 29/872; H01L 29/66143; H01L 29/7813; H01L 29/7806; H01L 29/1095
See application file for complete search history.

(56) References Cited

U.S. PATENT DOCUMENTS

| | | | | | |
|---|---|---|---|---|---|
| 6,091,108 | A | * | 7/2000 | Harris | H01L 29/0623 257/135 |
| 6,097,046 | A | * | 8/2000 | Plumton | H01L 21/74 257/266 |
| 6,767,783 | B2 | * | 7/2004 | Casady | H01L 29/6606 257/E21.066 |

(Continued)

*Primary Examiner* — John C Ingham
(74) *Attorney, Agent, or Firm* — Kilpatrick Townsend & Stockton LLP

(57) ABSTRACT

A method for fabricating a merged p-i-n Schottky (MPS) diode in gallium nitride (GaN) based materials includes providing an n-type GaN-based substrate having a first surface and a second surface. The method also includes forming an n-type GaN-based epitaxial layer coupled to the first surface of the n-type GaN-based substrate, and forming a p-type GaN-based epitaxial layer coupled to the n-type GaN-based epitaxial layer. The method further includes removing portions of the p-type GaN-based epitaxial layer to form a plurality of dopant sources, and regrowing a GaN-based epitaxial layer including n-type material in regions overlying portions of the n-type GaN-based epitaxial layer, and p-type material in regions overlying the plurality of dopant sources. The method also includes forming a first metallic structure electrically coupled to the regrown GaN-based epitaxial layer.

7 Claims, 8 Drawing Sheets

(56) References Cited

U.S. PATENT DOCUMENTS 6,936,850 B2 * 8/2005 Friedrichs ........... H01L 21/0485
257/109
2008/0251793 A1 * 10/2008 Mazzola ............... H01L 29/872
257/77

* cited by examiner

METHOD OF FABRICATING A MERGED P-N JUNCTION AND SCHOTTKY DIODE WITH REGROWN GALLIUM NITRIDE LAYER

This application claims priority from co-pending U.S. Provisional Patent Application No. 13/866,286, filed Apr. 19, 2013, entitled "METHOD OF FABRICATING A MERGED P-N JUNCTION AND SCHOTTKY DIODE WITH REGROWN GALLIUM NITRIDE LAYER," which is hereby incorporated by reference, as if set forth in full in this document, for all purposes.

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to forming merged p-i-n and Schottky (MPS) diodes using III-nitride semiconductor materials. In some embodiments, merged p-n and Schottky diodes are provided, which can also be referred to as MPS diodes. Merely by way of example, the invention has been applied to methods and systems for manufacturing MPS diodes using a regrowth of gallium-nitride (GaN) based epitaxial layers that include both p-type and n-type regions. These MPS diodes can be used in a range of applications that can benefit from a high-voltage switch with low capacitance and very low leakage current in the off state.

MPS diodes utilize a device structure that can be designed to exhibit the low turn-on voltage of a Schottky diode in the forward direction, and the low reverse leakage current of a p-n diode in the reverse. In addition, GaN MPS diodes outperform competitors in Si and SiC material systems due to the outstanding material properties of GaN. As described herein, an MPS diode includes a Schottky contact with embedded p-type (e.g., p+) regions within the area of the contact. The forward turn-on is dominated by the Schottky portion before the p-n junction turns on at a higher voltage. The reverse mode of operation is dominated by appropriately spaced p-n junctions. The same processing steps used to form the p-type regions may also be utilized as components of edge termination of the device.

According to an embodiment of the present invention, a method for fabricating a merged p-i-n Schottky (MPS) diode in gallium nitride (GaN) based materials includes providing an n-type GaN-based substrate having a first surface and a second surface. The method also includes forming an n-type GaN-based epitaxial layer coupled to the first surface of the n-type GaN-based substrate, and forming a p-type GaN-based epitaxial layer coupled to the n-type GaN-based epitaxial layer. The method further includes removing portions of the p-type GaN-based epitaxial layer to form a plurality of dopant sources, and regrowing a GaN-based epitaxial layer including n-type material in regions overlying portions of the n-type GaN-based epitaxial layer, and p-type material in regions overlying the plurality of dopant sources. The method also includes forming a first metallic structure electrically coupled to the regrown GaN-based epitaxial layer.

According to another embodiment of the present invention, an MPS diode can include a III-nitride substrate having a first side and a second side opposing the first side. The III-nitride substrate is characterized by a first conductivity type. The MPS diode also includes a first III-nitride epitaxial layer coupled to the III-nitride substrate and characterized by the first conductivity type, and a plurality of dopant sources coupled to the first III-nitride epitaxial layer and characterized by a second conductivity type. The MPS diode further includes a second III-nitride epitaxial layer overlying portions of the first III-nitride epitaxial layer and overlying the plurality of dopant sources. The second III-nitride epitaxial layer includes first regions characterized by the first conductivity type and second regions characterized by the second conductivity type. The MPS diode also includes a first metallic structure electrically coupled to the second III-nitride epitaxial layer.

According to yet another embodiment of the present invention, an MPS diode can include a III-nitride substrate, an n-type III-nitride epitaxial layer coupled to the III-nitride substrate, and a plurality of p-type dopant sources coupled to the n-type III-nitride epitaxial layer, each of the p-type dopant sources having opposing etched surfaces. The MPS diode can further include a regrown III-nitride epitaxial layer comprising n-type regions coupled to portions of the n-type III-nitride epitaxial layer and the opposing etched surfaces, and p-type regions coupled to the plurality of p-type dopant sources and interspersed between the n-type regions. A bulk interface is present between adjacent n-type and p-type regions.

Numerous benefits are achieved by way of the present invention over conventional techniques. For devices fabricated using embodiments of the present invention, utilization of the combined material properties of GaN such as high critical electric field, high electron mobility, and high thermal conductivity result in devices with performance advantages. The MPS diodes described herein have lower leakage currents for large reverse voltages compared to standard Schottky diodes, and almost no penalty in forward turn-on voltage. At large reverse bias conditions, the depletion region resulting from one reverse p-n junction will extend and merge with neighboring p-n junctions. In this case, the Schottky metal-to-semiconductor junction will not experience a large reverse electrical field, thus producing less leakage current. The device is suitable for applications where Schottky diodes are currently used, including high voltage applications, since the properties of GaN include high critical electric field at breakdown.

The MPS diode retains the fast switching speed of a majority carrier Schottky diode as long as the forward voltage does not exceed the level (e.g. about 3 volts) at which the p-n junction portion of the device turns on and injects minority carriers into the drift region, which need to be swept out when switching from on to off, as in a typical p-i-n diode. The regime when the p-i-n diode turns on is outside the normal area of operation for the device, but serves a useful purpose for surge current conditions. The minority carrier injection, which is detrimental in terms of switching speed, provides a benefit of lower on-state resistance than a Schottky diode would have due to conductivity modulation of the drift region.

The GaN MPS diode described herein provides a high voltage switch with excellent tradeoff between blocking voltage and forward resistance. The MPS diode has very low leakage current in the off state. A low forward resistance allows for a smaller area diode for a given current rating. Since capacitance scales with area, such a diode will retain excellent switching characteristics due to its low capacitance. The processing and fabrication methods described herein can also provide an effective edge termination technique suitable for commercial applications of the GaN MPS diode since edge termination enables the diode to reach the full potential associated with the outstanding GaN material properties. These and other embodiments of the invention, along with many of its advantages and features, are described in more detail in conjunction with the text below and attached figures.

DETAILED DESCRIPTION OF SPECIFIC EMBODIMENTS

Figure 1:
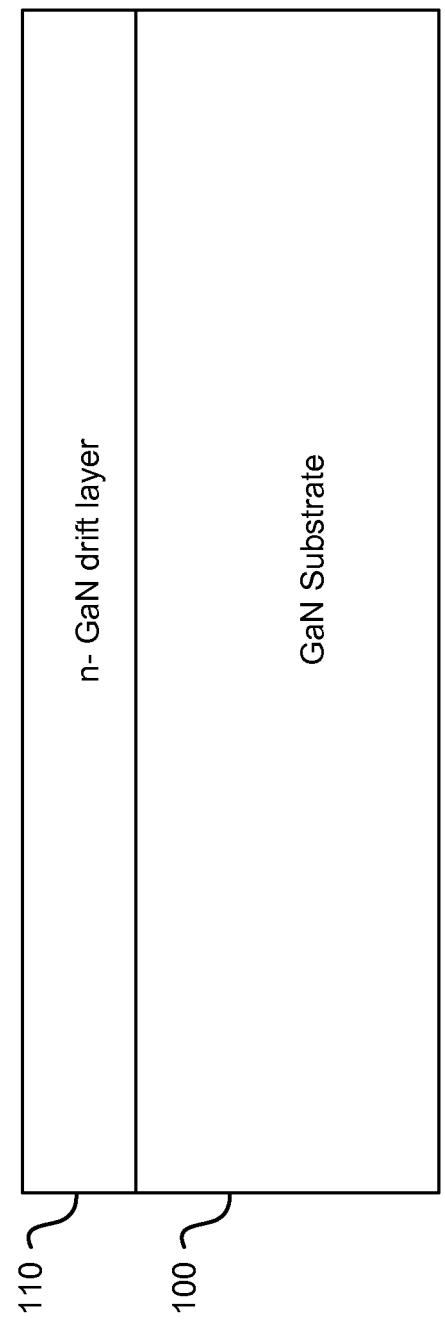
FIGS. 1-6 are simplified cross-sectional diagrams illustrating a process flow for fabrication of an MPS diode according to an embodiment of the present invention.

Embodiments of the present invention relate to electronic devices. More specifically, the present invention relates to forming merged p-i-n Schottky (MPS) diodes using III-nitride semiconductor materials. Merely by way of example, the invention has been applied to methods and systems for manufacturing MPS diodes using gallium-nitride (GaN) based epitaxial layers. These MPS diodes can be used in a range of applications that can benefit from a high-voltage switch with low capacitance and very low leakage current in the off state. Additional description related to MPS diodes is provided in U.S. patent application Ser. No. 13/270,625, entitled "Method of Fabricating a GaN Merged P-I-N Schottky (MPS) Diode," filed on Oct. 10, 2011, and U.S. patent application Ser. No. 13/585,121, entitled "Method of Fabricating a Gallium Nitride Merged P-I-N Schottky)MPS) Diode by Regrowth and Etchback," filed on Aug. 14, 2012, the disclosures of which are hereby incorporated by reference in their entirety for all purposes.

GaN-based electronic and optoelectronic devices are undergoing rapid development, and are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, µ, is higher than competing materials for a given doping level, N. This provides low resistivity, ρ, because resistivity is inversely proportional to electron mobility, as provided by equation (1):

$$\rho = \frac{1}{q\mu N}, \tag{1}$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \frac{\rho L}{A}, \tag{2}$$

where A is the cross-sectional area of the channel or current path.

Homoepitaxial GaN layers on bulk GaN substrates also have relatively low defect density compared to materials grown on mismatched substrates, such as GaN grown on silicon, silicon carbide (SiC), or sapphire. Homoepitaxial GaN layers on bulk GaN substrates therefore have large minority carrier lifetime in intrinsic and/or low-doped regions of semiconductor devices that use these materials, enhancing the carrier injection effect for wider base regions. The low defect density also gives rise to superior thermal conductivity.

As described herein, MPS diodes created using homoepitaxial GaN layers not only are able to take advantage of the outstanding physical qualities of these materials, but also benefit from the structural advantages provided by combining p-i-n and Schottky diodes. An MPS diode is a device structure that can be designed to exhibit the low turn-on voltage of a Schottky diode in the forward direction, and the low reverse leakage current of a p-i-n diode in the reverse direction. An MPS diode can include a Schottky contact with one or more embedded p-n junctions (or p-i-n regions) within the area of the contact. The forward turn-on voltage is dominated by the Schottky portion before the p-n junctions turn on at a higher forward voltage. The reverse mode of operation is dominated by appropriately spaced p-n junctions. Furthermore, in some embodiments, the same processing used to form the p-n junctions embedded within the area of the Schottky contact also can be used to form edge termination structures to provide edge termination for the MPS diode.

According to embodiments of the present invention, gallium nitride (GaN) epitaxy on bulk or pseudo-bulk GaN substrates is utilized to fabricate MPS diodes and/or edge termination structures not possible using conventional techniques. For example, conventional methods of growing GaN include using a foreign substrate such as SiC. This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create edge termination structures for various types of semiconductor devices.

FIGS. 1-6 are simplified cross-sectional diagrams illustrating a process flow for fabrication of an MPS diode according to a first embodiment of the present invention.

FIG. 1 illustrates an epitaxial system suitable for use with embodiments of the present invention. As illustrated in FIG. 1, a first III-N epitaxial layer 110 (e.g., a GaN lightly doped n-type drift layer) is formed on a III-N substrate 100 (e.g., an n-type GaN substrate) having the same conductivity type. The III-N substrate 100 will be referred to as a GaN substrate below and can be a bulk or pseudo-bulk GaN material on which the first GaN epitaxial layer 110 is grown.

Dopant concentrations (e.g., doping density) of the GaN substrate 100 can vary, depending on desired functionality. For example, GaN substrate 100 can have an n+ conductivity type, with dopant concentrations ranging from $1\times10^{17}$ cm$^{-3}$ to $1\times10^{20}$ cm$^{-3}$. Although the GaN substrate 100 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

Although some embodiments provided herein (e.g., the embodiment illustrated in FIGS. 1-6) are discussed in terms of GaN substrates and GaN epitaxial layers, the present invention is not limited to these particular binary III-V materials and is applicable to a broader class of III-V materials, in particular III-nitride materials. Additionally, although a GaN substrate is illustrated in some implementations, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

The properties of the first III-N epitaxial layer 110, referred to as a III-N epitaxial layer or a first GaN epitaxial layer below, can also vary, depending on desired functionality. The first GaN epitaxial layer 110 can serve as a drift layer for the Schottky region(s) of the MPS diode and an intrinsic component for the p-i-n junction(s) of the MPS diode. Thus, the first GaN epitaxial layer 110 can be a relatively low-doped material. For example, the first GaN epitaxial layer 110 can have an n− conductivity type, with dopant concentrations ranging from $1\times10^{14}$ cm$^{-3}$ to $1\times10^{18}$ cm$^{-3}$. Furthermore, the dopant concentration can be uniform, or can vary, for example, as a function of the thickness of the drift region.

The thickness of the first GaN epitaxial layer 110 can also vary substantially, depending on the desired functionality. As discussed above, homoepitaxial growth can enable the first GaN epitaxial layer 110 to be grown far thicker than layers formed using conventional methods. In general, in some embodiments, thicknesses can vary between 0.5 μm and 100 μm, for example. In other embodiments thicknesses are greater than 5 μm. Resulting breakdown voltages for the MPS diode can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Different dopants can be used to create n- and p-type GaN epitaxial layers and structures disclosed herein. For example, n-type dopants can include silicon, oxygen, germanium, or the like. P-type dopants can include magnesium, beryllium, zinc, or the like.

Figure 2:
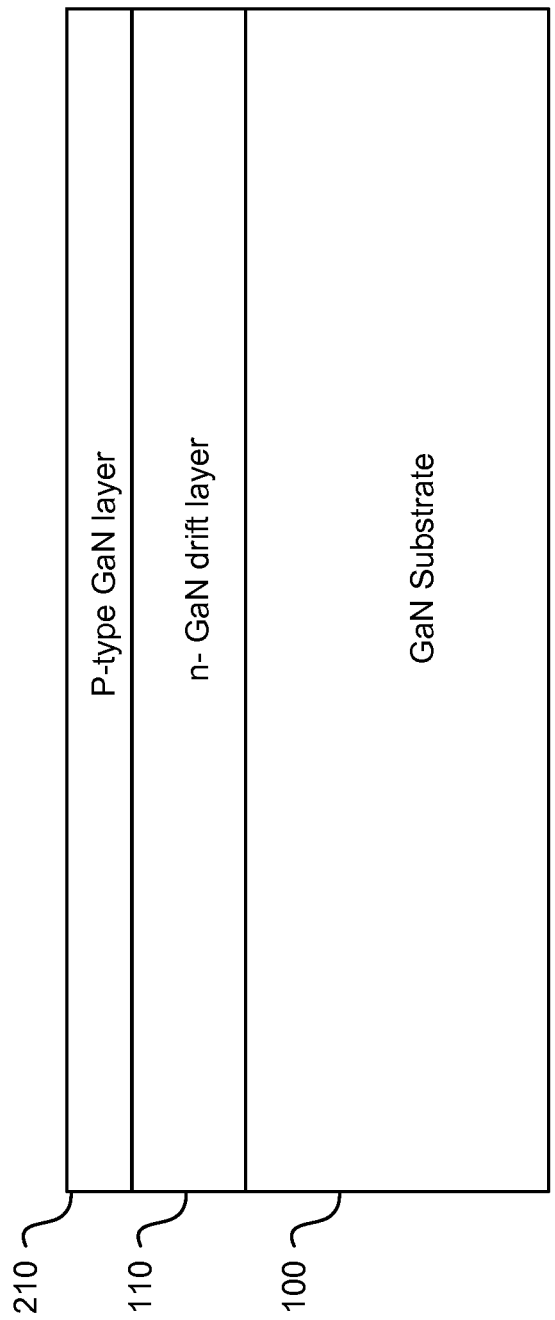

FIG. 2 illustrates the formation, for example, by epitaxial growth, of a p-type III-N epitaxial layer 210. As described below, the p-type III-N epitaxial layer 210 (e.g., a GaN layer) will provide dopant source regions fabricated from the epitaxial material. The thickness of the epitaxial layer 210 can range from about 50 nm to about 1000 nm in some embodiments, for example, 100 nm. In some particular embodiments, a dopant species (e.g., magnesium) is formed on the first GaN epitaxial layer 110, with the thickness of the epitaxial layer 210 tending towards zero. In these particular embodiments, the dopant source is only or substantially the dopant species. In other embodiments, a thin epitaxial layer (e.g., ranging from 1 nm to 100 nm) that is heavily doped with p-type dopants is grown to form the layer used in providing the dopant sources. One of ordinary skill in the art would recognize many variations, modifications, and alternatives.

Figure 3:
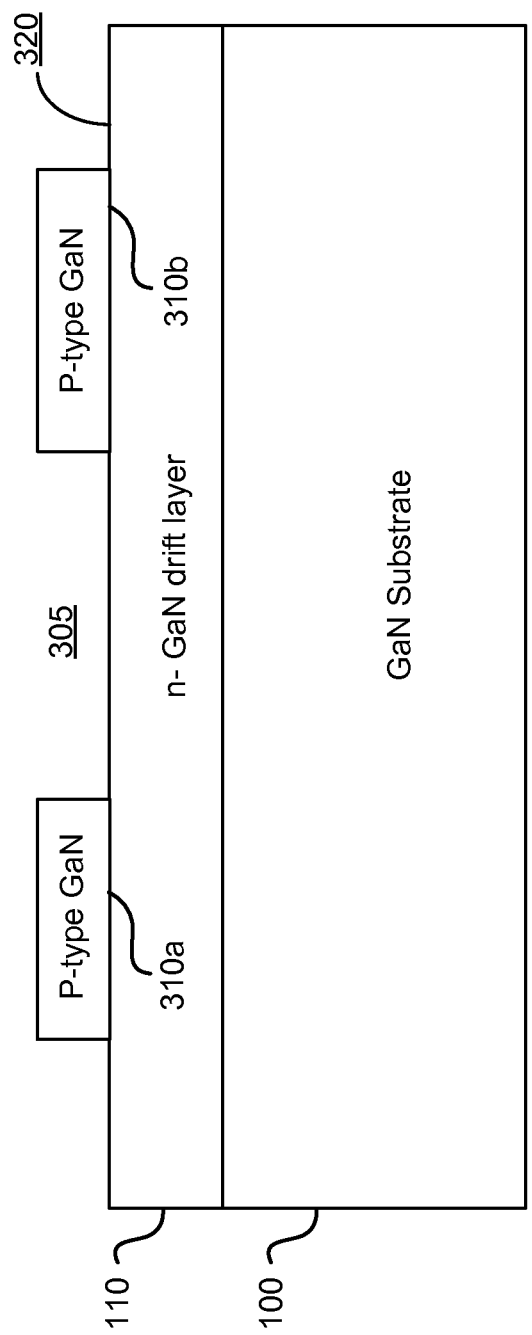

FIG. 3 illustrates the formation of dopant sources 310a and 310b by the patterning and removal of portions of the p-type III-N epitaxial layer 210. The removal of portions of the p-type III-N epitaxial layer to form the dopant sources 310a and 310b can be performed by a controlled etch using an etch mask (not shown but having the dimensions of openings 305 between adjacent dopant sources). The vertical sides of the dopant sources can be referred to as opposing etched surfaces. As described more fully below, epitaxial structures forming part of the Schottky portions of the MPS diode are formed in the openings 305, so the removal of portions of the p-type III-N epitaxial layer can be designed to stop at approximately the top surface 320 of the first GaN epitaxial layer 110 or at a desired depth in the first GaN epitaxial layer. Moreover, the removal process may involve multiple etching steps resulting in different depths for different components of the MPS diode. Inductively-coupled plasma (ICP) etching and/or other common GaN etching processes can be used. One of ordinary skill in the art would recognize many variations, modifications, and alternatives.

Figure 4:
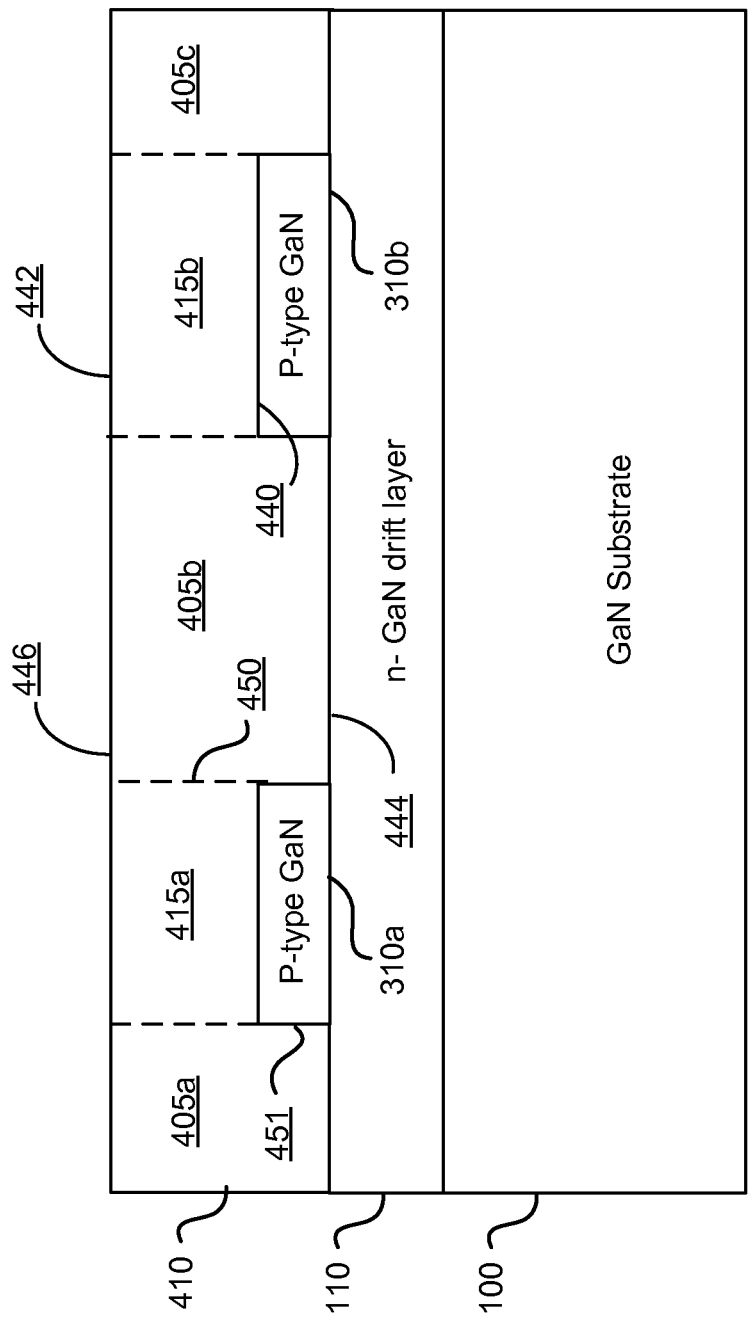

FIG. 4 illustrates epitaxial regrowth according to an embodiment of the present invention. As described below, the regrown GaN-based epitaxial layer 410 includes n-type material in regions overlying portions of the n-type GaN-based epitaxial layer 110 and p-type material in regions overlying the plurality of dopant sources 310. As illustrated in FIG. 4, a III-N epitaxial layer 410 has been regrown, filling the openings 305 and extending to a height greater than the height of the dopant sources 310a and 310b, for example, a height ranging from about 50 nm to about 500 nm. In a particular embodiment, the thickness of III-N epitaxial layer 410 is about 200 nm. The III-N epitaxial layer 410 can be referred to as a second epitaxial layer or a regrown epitaxial layer since epitaxial layer 410 is coupled to portions of the first epitaxial layer 110 and regrown over the dopant sources 310. The presence of the dopant sources results in III-N epitaxial layer 410 having differing dopant characteristics as a function of lateral position. In regions 405a, 405b, and 405c, n-type material (e.g., n− GaN epitaxial material) is regrown. Accordingly, in these regions, an n-type region is formed in electrical connection with the n-type drift layer.

In regions 415a and 415b, the presence of the dopant sources underlying the regrown material results in p-type doping of regions 415a and 415b. Thus, as stated above, the dopant characteristics vary laterally, with p-type regions interspersed among n-type regions. Without limiting embodiments of the present invention, the inventors believe that p-type dopants (e.g., magnesium) present in the dopant sources carry over into the regrown material, producing p-type dopant (e.g., magnesium) incorporation into the regrown material. Magnesium present on the top surface of the dopant sources can be incorporated in the regrown material although this particular mechanism is not required by embodiments of the present invention. In some embodiments, although the regrowth conditions during the formation of III-N epitaxial layer 410 are suitable for the growth of n-type material, resulting in n-type regions 405a, 405b, and 405c, p-type regions 415a and 415b are also formed, despite the presence of n-type dopants in the regrowth precursors.

Referring to FIG. 4, p-n junctions are present at the interface between n-type layer 110 and dopant sources 310a and 310b, which are, in turn electrically connected to p-type regions 415a and 415b. N-type regions suitable for the Schottky diode elements are provided by n-type regions 405a, 405b, and 405c in electrical contact with n-type layer 110. Although not illustrated, embodiments of the present invention can utilize interfacial layers before or during the regrowth process. One of ordinary skill in the art would recognize many variations, modifications, and alternatives.

One method of regrowing epitaxial layer 410 can be through a regrowth process as described more fully in U.S. patent application Ser. No. 13/198,666, entitled "Method and System for Formation of p-n Junctions in Gallium Nitride Based Electronics," filed on Aug. 4, 2011, the disclosure of which is hereby incorporated by reference in its entirety. As illustrated herein, blanket regrowth provides benefits in comparison with some selective area regrowth techniques since in some selective regrowth techniques, the hard mask can decompose, resulting in incorporation of the hard mask materials into the epitaxially regrown materials. By using a blanket regrowth process, the regrowth mask is eliminated and material properties are improved.

Referring once again to FIG. 4, the regrown regions 415a and 415b disposed between regrown regions 405a, 405b, and 405c are characterized by a different conductivity type than the first GaN epitaxial layer 110, thereby forming the p-i-n structures of the MPS diode. In one embodiment, for example, the regrown material in regions 415a and 415b has a p+ conductivity type and the first GaN epitaxial layer 110 has an n– conductivity type. The dopant concentration of the regions can be relatively high, for example in a range from about $1\times10^{17}$ cm$^{-3}$ to about $2\times10^{20}$ cm$^{-3}$. In some embodiments, the dopant concentration in regrown regions 415a and 415b decreases as a function of distance from dopant sources 310a and 310b, respectively.

The thickness of the regrown epitaxial layer 410 can vary, depending on the process used to form the layer and the device design. In some embodiments, the thickness of the epitaxial layer 410 is between 0.05 µm and 5 µm, for example, 0.2 µm.

The dopant concentration of regrown epitaxial regions 405 can be uniform or non-uniform as a function of thickness, depending on desired functionality. In some embodiments, for example, the dopant concentration of n-type dopants in regions 405 increases or decreases with thickness, such that the dopant concentration is relatively low or high near the n-type GaN drift layer 110 and increases or decreases as the distance from the drift layer increases.

Referring to FIG. 4, in an embodiment, the p-type doping concentration in regions 415 at surface 440 will be higher than the doping concentration at surface 442 as the doping concentration decreases with height. For the n-type doping in regions 405, the doping concentration at surface 444 can be lower or higher than the doping concentration at surface 446 in some embodiments as the doping decreases or increases with height, although this is not required by embodiments of the present invention. One of ordinary skill in the art would recognize many variations, modifications, and alternatives.

Embodiments of the present invention provide benefits not available using conventional techniques since the interface 450 between the p-type and n-type materials is a bulk interface formed during the epitaxial regrowth process, not an etched interface that would be present if the p-type material was regrown adjacent to as-grown n-type material that had been etched to define the lateral characteristics of the MPS device. Although the bulk interfaces 450 are illustrated as vertical in the figure, this is not required by the present invention and other interface profiles including curved surfaces are included within the scope of the invention. Referring to FIG. 4, the height of interface 450 is typically greater than the thickness of the dopant sources, resulting in MPS diodes in which portions (e.g., the majority) of the thickness of the regrown n-type epitaxial material includes substantially vertical p-n interfaces in bulk material. The inventors have determined that p-n interfaces in bulk material provide enhanced device properties in comparison to p-n interfaces present at etched surfaces such as surface 451.

As illustrated in FIG. 4, the MPS diode includes a plurality of P-N junction regions 405 that include a regrown p-type material 415, an epitaxial p-type material 310, and n-type material (drift layer 110). Interspersed with the p-n junction regions, the MPS diode has a plurality of Schottky regions that include regrown n-type material 405 and n-type material (drift layer 110). The interfaces between the regrown p-type regions and the regrown n-type regions include (e.g., are substantially) bulk epitaxial interfaces in addition to etched interfaces between the dopant sources and the regrown n-type regions. Thus, in a single regrowth process, both p-type and n-type regions are fabricated in an epitaxially regrown layer simultaneously.

Although embodiments of the present invention are discussed in relation MPS diodes and methods for fabricating MPS diodes, the invention is not limited to this particular device structure and can be applied more generally to lateral non-uniform doping of III-nitride materials and the fabrication of devices that utilize lateral non-uniform doping. Thus, a variety of GaN-based electronic devices in which a regrown GaN layer includes interspersed n-type and p-type regions are included within the scope of the present invention. These devices can include a lateral p-n junction structure that includes a substrate, n-type epitaxially grown regions, p-type epitaxially grown regions, and regrown GaN-based layer(s) that include both n-type regrown material and p-type regrown material. One of ordinary skill in the art would recognize many variations, modifications, and alternatives.

Figure 5A:
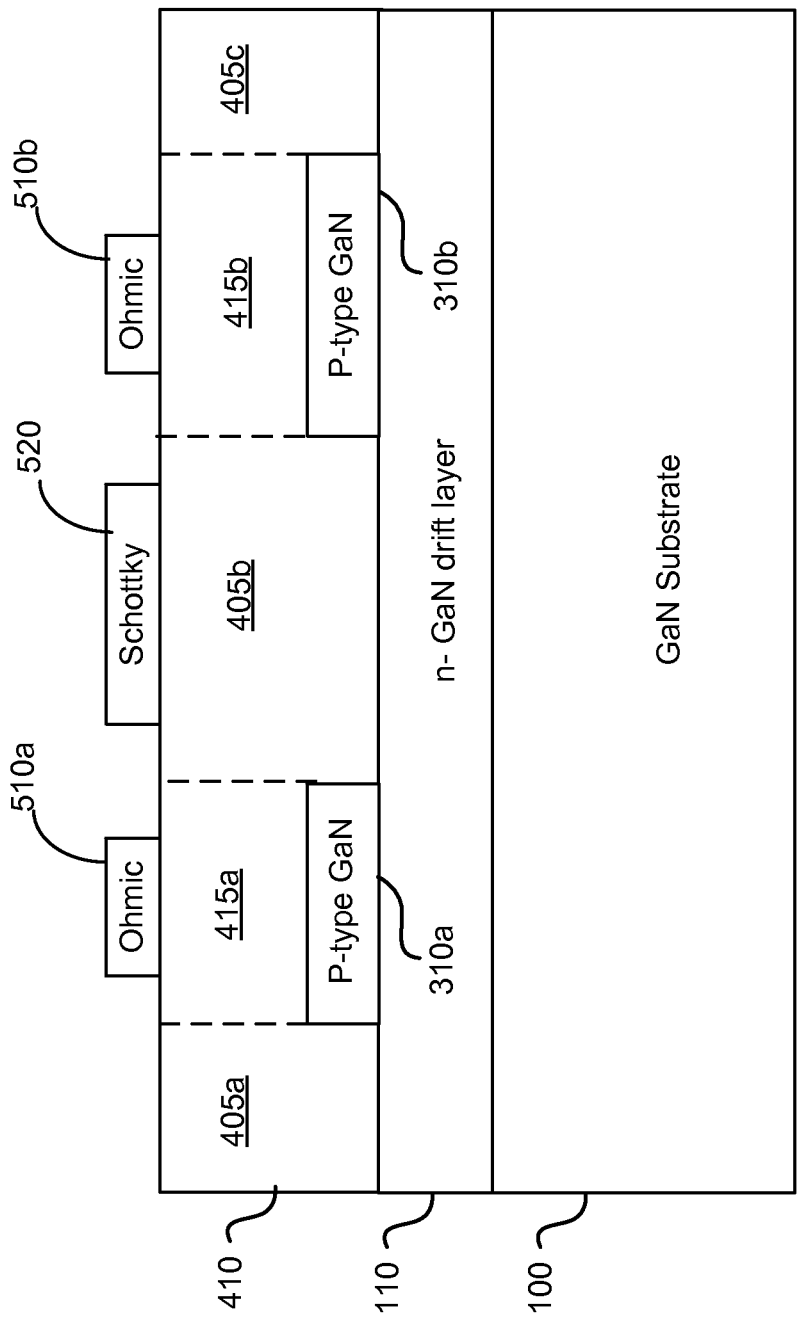

FIG. 5A illustrates the formation of ohmic and Schottky contacts on the surface of the regrown III-N layer 410. Ohmic contacts 510a and 510b are made to p-type regrown regions 415a and 415b, respectively and Schottky contacts 520 are made to n-type regrown regions 405, with a single Schottky contact to region 405b illustrated in FIG. 5A. Although separate ohmic and Schottky contacts are illustrated in FIG. 5A, this is not required by embodiments of the present invention and a single contact metal structure can be formed using one or more layers of metal and/or alloys designed to create a Schottky barrier with the n-type regrown regions 405, which have a relatively low dopant concentration and ohmic contacts with p-type regrown regions 415, which have relatively high dopant concentration and form the p-i-n portions of the MPS diode. Although not illustrated for purposes of clarity, peripheral p-type regrown regions can be utilized for edge termination of the MPS diode. The contact metals can be formed using a variety of techniques, including lift-off and/or deposition with subsequent etching, which can vary depending on the metals used. In some embodiments, the contact metals can include nickel, platinum, palladium, silver, gold, scandium and the like.

Figure 5B:
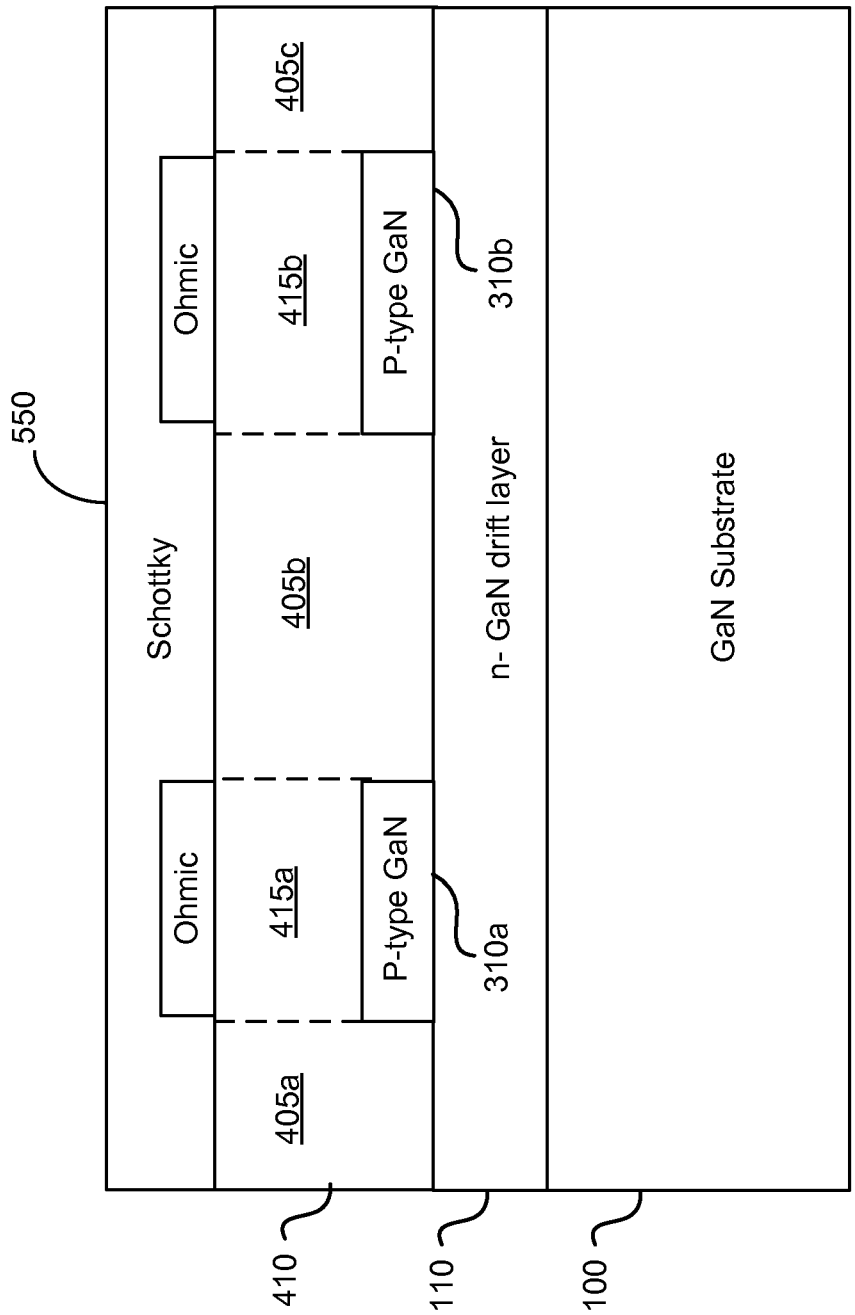

FIG. 5B illustrates an alternative embodiment in which ohmic contacts are formed as discussed in relation to FIG. 5A followed by formation of blanket Schottky contact 550.

Figure 6:
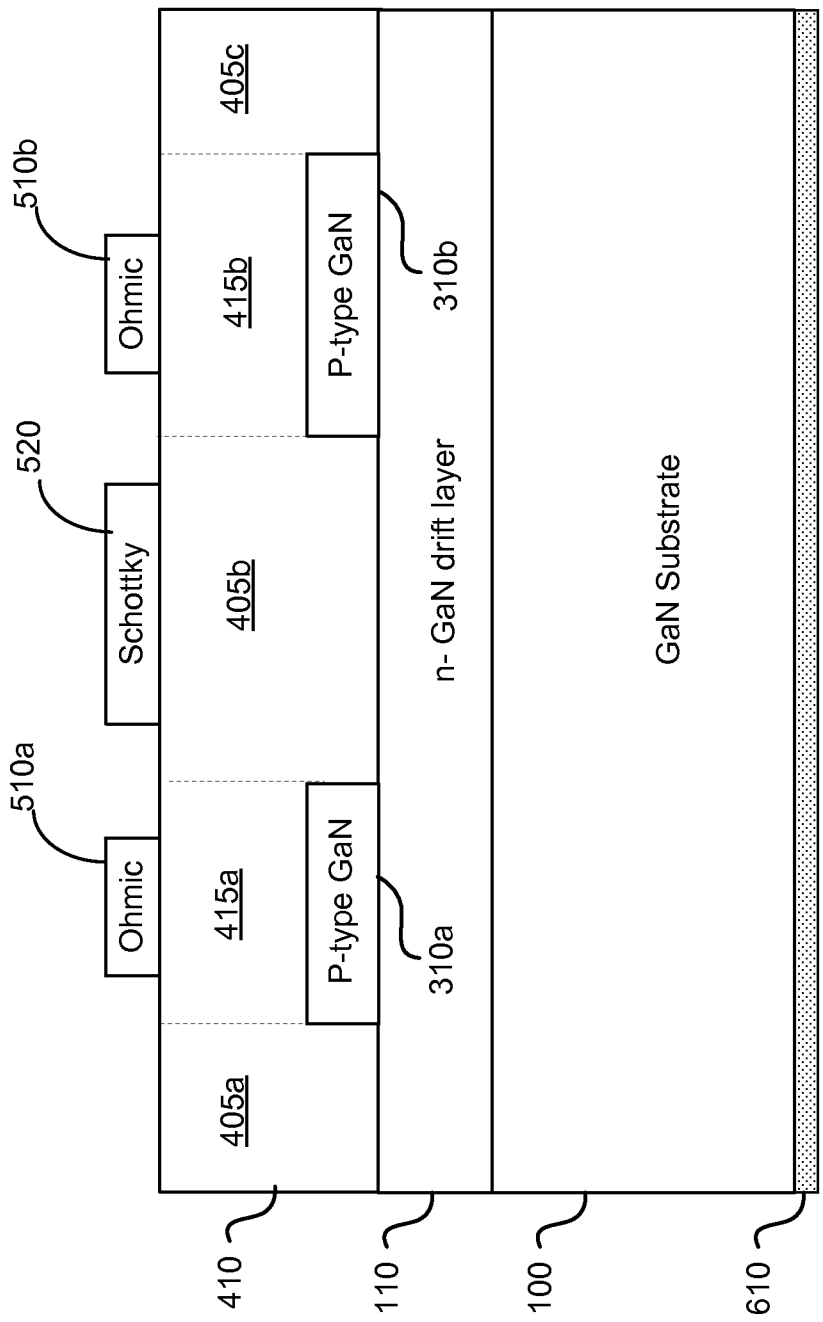

FIG. 6 illustrates the formation of a back metal structure 610 on the bottom of GaN substrate 100. The back metal structure 610 can be one or more layers of ohmic metal that serve as a contact for the cathode of the MPS diode. For example, the back metal structure 610 can comprise a titanium-aluminum (Ti/Al) ohmic metal. Other metals and/or alloys can be used including, but not limited to, titanium, aluminum, nickel, palladium, gold, silver, combinations thereof, or the like. In some embodiments, an outermost metal of the back metal structure 610 can include gold, tantalum, tungsten, palladium, silver, or aluminum, combinations thereof, and the like. The back metal structure 610 can be formed using any of a variety of methods such as sputtering, evaporation, or the like.

Figure 7:
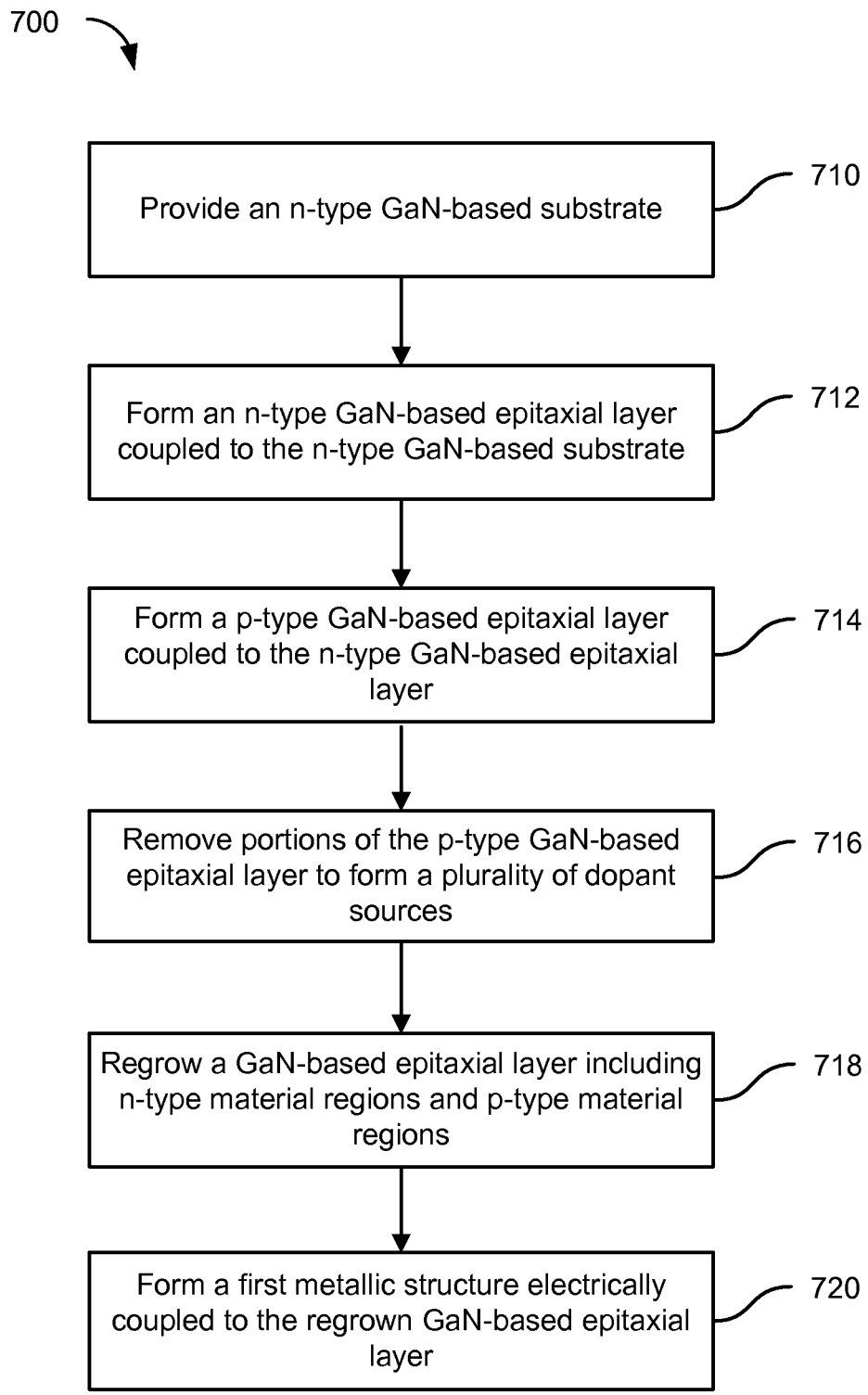
FIG. 7 is a simplified flowchart illustrating a method of fabricating an MPS diode according to an embodiment of the present invention.

FIG. 7 is a simplified flowchart illustrating a method of fabricating an MPS diode (i.e., a merged p-i-n Schottky diode or a merged p-n Schottky diode) according to an embodiment of the present invention. The method 700 is suitable for the fabrication of an MPS diode in gallium nitride (GaN) based materials. The method includes providing an n-type GaN-based substrate having a first surface and a second surface (710) and forming an n-type GaN-based epitaxial layer coupled to the first surface of the n-type GaN-based substrate (712). The n-type GaN-based epitaxial layer can be used as the drift layer of the MPS diode. The n-type GaN-based substrate is characterized by a first n-type dopant concentration and the n-type GaN-based epitaxial layer is characterized by a second n-type dopant concentration that is typically less than the first n-type dopant concentration.

The method also includes forming a p-type GaN-based epitaxial layer coupled to the n-type GaN-based epitaxial layer (714) and removing portions of the p-type GaN-based epitaxial layer to form a plurality of dopant sources (716). The method further includes regrowing a GaN-based epitaxial layer including n-type material in regions overlying portions of the n-type GaN-based epitaxial layer and p-type material in regions overlying the plurality of dopant sources (718). In some implementations, the regrowth of the GaN-based epitaxial layer is a blanket regrowth process.

Additionally, the method includes forming a first metallic structure electrically coupled to the regrown GaN-based epitaxial layer (720). In an embodiment, the first metallic structure includes Schottky contacts electrically coupled to the n-type material in the regions overlying portions of the n-type GaN-based epitaxial layer and ohmic contacts electrically coupled to the p-type material in the regions overlying the plurality of dopant sources. In order to fabricate the cathode of the MPS diode, a second metallic structure electrically coupled to the second surface of the n-type GaN-based substrate can be formed. In addition to diode functionality, embodiments of the present invention can also include edge termination functionality in which at least one of the regions overlying the plurality of dopant sources is configured to provide edge termination to the MPS diode. Additionally, at least one of the regions overlying the plurality of dopant sources can be configured to provide a junction termination extension to the MPS diode.

It should be appreciated that the specific steps illustrated in FIG. 7 provide a particular method of fabricating an MPS diode according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a merged p-i-n Schottky (MPS) diode in gallium nitride (GaN) based materials, the method comprising:
   providing an n-type GaN-based substrate having a first surface and a second surface;
   forming an n-type GaN-based epitaxial layer coupled to the first surface of the n-type GaN-based substrate;
   forming a p-type GaN-based epitaxial layer coupled to the n-type GaN-based epitaxial layer;
   removing portions of the p-type GaN-based epitaxial layer to form a plurality of dopant sources;
   regrowing a GaN-based epitaxial layer including n-type material in regions overlying portions of the n-type GaN-based epitaxial layer and p-type material in regions overlying the plurality of dopant sources; and
   forming a first metallic structure electrically coupled to the regrown GaN-based epitaxial layer.

2. The method of claim 1 wherein the first metallic structure comprises Schottky contacts electrically coupled to the n-type material in the regions overlying portions of the n-type GaN-based epitaxial layer and ohmic contacts electrically coupled to the p-type material in the regions overlying the plurality of dopant sources.

3. The method of claim 1 further comprising forming a second metallic structure electrically coupled to the second surface of the n-type GaN-based substrate.

4. The method of claim 1 wherein regrowing the GaN-based epitaxial layer comprises using a blanket regrowth process.

5. The method of claim 1 wherein the n-type GaN-based substrate is characterized by a first n-type dopant concentration and the n-type GaN-based epitaxial layer is characterized by a second n-type dopant concentration less than the first n-type dopant concentration.

6. The method of claim 1 wherein at least one of the regions overlying the plurality of dopant sources is configured to provide edge termination to the MPS diode.

7. The method of claim 1 wherein at least one of the regions overlying the plurality of dopant sources is configured to provide a junction termination extension to the MPS diode.

* * * * *